United States Patent
Berkely

(10) Patent No.: US 6,806,718 B2
(45) Date of Patent: Oct. 19, 2004

(54) ON-CIRCUIT BOARD CONTINUITY TESTER

(75) Inventor: Ryan S. Berkely, Long Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/644,477

(22) Filed: Aug. 21, 2003

(65) Prior Publication Data

US 2004/0036466 A1 Feb. 26, 2004

Related U.S. Application Data

(62) Division of application No. 09/921,671, filed on Aug. 3, 2001, now Pat. No. 6,614,253.

(51) Int. Cl.[7] .................................. G01R 31/00
(52) U.S. Cl. ........................ 324/500; 324/765
(58) Field of Search ............... 324/765, 158.1, 324/538, 763, 754, 750, 519, 537, 703, 95, 655; 340/608, 514, 507

(56) References Cited

U.S. PATENT DOCUMENTS 5,517,110 A * 5/1996 Soiferman ............... 324/158.1
6,087,842 A * 7/2000 Parker et al. ............... 324/763

* cited by examiner

Primary Examiner—David A. Zarneke
Assistant Examiner—Trung Q. Nguyen
(74) Attorney, Agent, or Firm—Ronald M. Goldman

(57) ABSTRACT

For qualification testing in product development, a test assembly contains a surrogate circuit board (7) and surrogate electronic modules (5) supported thereon. The terminals (5a–5j) of the modules are joined to respective bonding pads (2a–2j) on the circuit board to form bonded joints. The modules terminals and the wiring of the associated bonding pads is configured to produce at least one test series circuit (21) associated with each module that includes the bonded joints. A tester (9) supported on the circuit board monitors the test series circuit and produces a persistent indication (10) should a break or interruption occur in a bonded joint or any other portion of the test series circuit. This allows indications of transient breaks that occurred when the test assembly was being subjected to stresses, such as those induced by temperature excursions, mechanical vibration, and/or mechanical shock to be preserved and recorded at a later time.

4 Claims, 5 Drawing Sheets

ON-CIRCUIT BOARD CONTINUITY TESTER

REFERENCE TO PRIOR APPLICATIONS

This application for patent is related to the application of Ryan S. Berkely, entitled, On-Circuit Board, Continuity Tester, U.S. Ser. No. 09/921,671, filed Aug. 3, 2001, now U.S. Pat. No. 6,614,253 and is a divisional of that application. Applicant claims the benefit of 35 U.S.C. §120 with respect to the foregoing application.

FIELD OF THE INVENTION

This invention relates to proofing of semiconductor electronic assemblies, and, more particularly, to a method and apparatus to test and detect failures, both permanent and transient, during environmental test cycling of any solder joints of the electronic module-to-circuit board connections, such as ball grid arrays and/or other electronic module-to-circuit board fastening technology, and indicating such failure.

BACKGROUND

Given the objectives to be achieved by an electronic assembly, circuit designers may create or select the functional characteristics for the electronic assembly and the hardware to implement the assembly. That design information is turned over to manufacturing engineers who in turn specify or create the manufacturing processes and technology required for mass or volume production of a high quality reliable product that should have a reasonable operational life and production cost. In creating a new electronic assembly, often the circuit design and/or manufacturing technology "pushes" the state of the art, so to speak, and one finds there are limits to what is known of a particular manufacturing technology and design.

To advance the knowledge beyond existing limits, the manufacturing engineer necessarily resorts to "qualification" testing of the electronic assembly. That testing particularly involves testing the behavior of a structure over extremes of temperature, and shock and vibration, herein collectively referred to as environmental testing. When the product is intended for critical applications, such as in space vehicles, environmental testing of the technology or technology infrastructure to produce the product is typically accomplished, incrementally, in stages. In so doing, problems in the technological infrastructure revealed by the test may be investigated, isolated and solved, prior to proceeding to a succeeding stage of product development. As each stage of development is so "proofed", one acquires the confidence that the product or electronic assembly when fully developed will perform as intended and is, hence, "qualified".

One important stage of such development process is to ensure that the selected soldering technology properly solders the electronic modules to the circuit board. The manufacturing engineer must have or acquire a high degree of confidence that the electronic assembly should not prematurely fail in service due to a defect in the electrical connections, the solder joints, between the electronic module and the circuit board or in the wiring of the circuit board. Typically, for that purpose a prototype or surrogate assembly is fabricated and subjected to the environmental testing. Should the prototype pass those tests, the necessary confidence in the technology is gained. The present invention relates to the foregoing stage of development and testing.

Advanced electronics assemblies used in spacecraft and avionics apparatus incorporate a large number of electronic modules that are very densely packed on a multi-layer circuit board. Because of the dense packing of the electronic modules, the metal interconnections formed on the various layers of the circuit board are necessarily thin, possibly even thinner than 0.001 inch. And the number of layers in the circuit board may be quite large, as many as twenty-four layers not being unusual. The number of modules may exceed one hundred, and the number of module-to-circuit board connections often is greater than four hundred. Some electronic modules may contain 1,000 or more terminals that are connected to corresponding metal bonding pads on the upper surface of the circuit board. For such an application the electronic module structures may be selected from amongst a number of known types, including hermetically sealed types such as ceramic column grid arrays ("CCGA's"), ceramic quad flat pack ("CQFP's"), ceramic dimpled ball grid array ("CBGA's"); or non-hermetic types, such as plastic encapsulated microelectronic circuits ("PEM's"), including plastic ball grid arrays ("PBGA's"), and plastic quad flatpacks ("PQFP's"), all of which are known in the art.

One example of an unknown concerns plastic encapsulated ball grid arrays ("PBGA's"). The PBGA offers a packaging and fastening technology for an electronic module that is less expensive than CCGA's and CQFP's. For that reason the PBGA appears most desirable. However, because the PBGA modules have not been used extensively in space based applications, the level of confidence in their reliability in that application is necessarily low as compared to other types of module connections (notably leaded as opposed to leadless types) that have already been proven. Considering that the operation of a spacecraft or a spacecraft electronic system may be jeopardized by even a momentary break in a solder joint in an electronic assembly, the development procedure should ensure that such a break should not be likely to occur. Environmental testing offers the means to raise the confidence level in the foregoing PBGA technology, particularly the confidence of the manufacturer who may be required to offer guarantees to the customer.

The ball grid array portion of an electronic module includes solder balls adhered to the underside of the module. Such modules are typically attached to a circuit board by pre-coating the bonding pads on the circuit board with solder paste, placing the modules loosely into position in the paste, and reflowing the solder paste and solder balls by heating in an infra-red, convection, or vapor phase oven. This electrically and mechanically bonds the solder balls to the associated bonding pads on the circuit board, forming respective solder joints. Because those solder joints are minute in size, are located on the underside and are covered by the package of the module, it is not possible to visually inspect all those solder joints. An indirect means for testing the joints is necessary. The present invention provides the necessary process and apparatus for such testing.

Testing the integrity of solder joints in an electronic assembly or even the wiring of a circuit board is not new. Others have disclosed methods of testing solder joints. U.S. Pat. No. 5,420,500 discloses that a stimulus signal can be capacitively coupled to the component under test to measure the signal level of the solder lead under test. U.S. Pat. No. 5,493,775 discloses that "opens" in pressure contacts can be detected by transmitting acoustic waves at the solder joint and comparing the harmonics of the received acoustic wave with that of the transmitted acoustic wave. U.S. Pat. No. 6,087,842 and U.S. Pat. No. 6,097,203 disclose that electromagnetic probes may be integrated in an integrated circuit to provide capability for testing continuity between integrated circuits. And U.S. Pat. No. 5,254,953 disclosed that capacitive coupling can be used to detect proper soldering of semiconductor components within a printed circuit board. As becomes apparent, the present invention is believed to be more "user-friendly" and better suited to testing of large numbers of densely packed inaccessible solder joints and to the detection during environmental testing of breaks in solder joints that are but transient in duration than any of the techniques presented in the foregoing patents.

Accordingly, an object of the present invention is to provide a new and relatively simple apparatus and procedure for indicating transient failure of solder joints and/or electrical wiring in an electronic assembly during environmental testing.

An additional object of the invention is to reduce the time and cost of qualification testing of electronic assemblies.

A further object of the invention is to efficiently proof the integrity of plastic encapsulated ball grid array modules or other such area-array packages during environmental testing. And A still further object of the invention is to provide a new method and apparatus for detecting and displaying transient discontinuity in electrical wiring of a circuit board.

SUMMARY OF THE INVENTION

In accordance with the foregoing objects and advantages, the present invention provides a new procedure and apparatus for qualification testing of electronic assembly fabrication technology in product development for volume production. A test assembly containing a surrogate circuit board and surrogate electronic modules are supported on the circuit board. The terminals of the modules are joined to respective bonding pads on the circuit board to form bonded joints. The terminals of the surrogate modules and the wiring of the bonding pads associated with those modules is configured to produce at least one test series circuit associated with each module, including bonded joints. Such test series circuit may be formed of a row, zone or sub-array of bonding pads. A continuity tester supported on the circuit board monitors the test series circuit and produces a persistent indication to alert the operator of an interruption of that series circuit, should a break or interruption occur in a bonded joint of the series circuit.

To proof the reliability of the bonded joints, the test assembly is subjected to temperature and/or vibration and shock cycling. Should a break or a transient break occur in the test series circuit, the test operator is able to easily determine the existence of a transient break by the persistent indication of the continuity tester.

Further in accordance with the invention, a control unit, located off the circuit board and external to the test assembly, supplies power and operator controls for the test assembly through a test cable. In accordance with an additional aspect to the invention, multiple testers may be included on the circuit board to separately monitor respective series circuits associated with respective modules on the circuit board.

In accordance with a more specific aspect to the invention, the continuity tester comprises a bistable electronic switch and an LED. Normally the bistable switch is placed in one output state. When a break is detected the switch changes to the second output state and supplies energy to the LED, which illuminates.

As an advantage, the continuity tester is mounted in close proximity to the series circuit being tested. Hence, the tester is able to respond to exceedingly brief transients, irrespective of the length of the test cable. As a further advantage, only four off-circuit board connections are required for control of the multiple on-board testers, regardless of the number of testers included in the test assembly. As a still further advantage, because each tester is dedicated to monitor a single series circuit, the tester is able to electronically stare at the series circuit and detect every transient event. The invention provides an effective testing arrangement the implementation of which is very low in cost. With the invention use of expensive off-board scanning testers for long term tests, such as automated thermal cycling lasting many months, is avoided.

The foregoing and additional objects and advantages of the invention, together with the structure characteristic thereof, where were only briefly summarized in the foregoing passages, will become more apparent to those skilled in the art upon reading the detailed description of a preferred embodiment of the invention, which follows in this specification, taken together with the illustrations thereof presented in the accompanying drawings.

DESCRIPTION OF THE PREFERRED EMBODIMENTS

Figure 1:
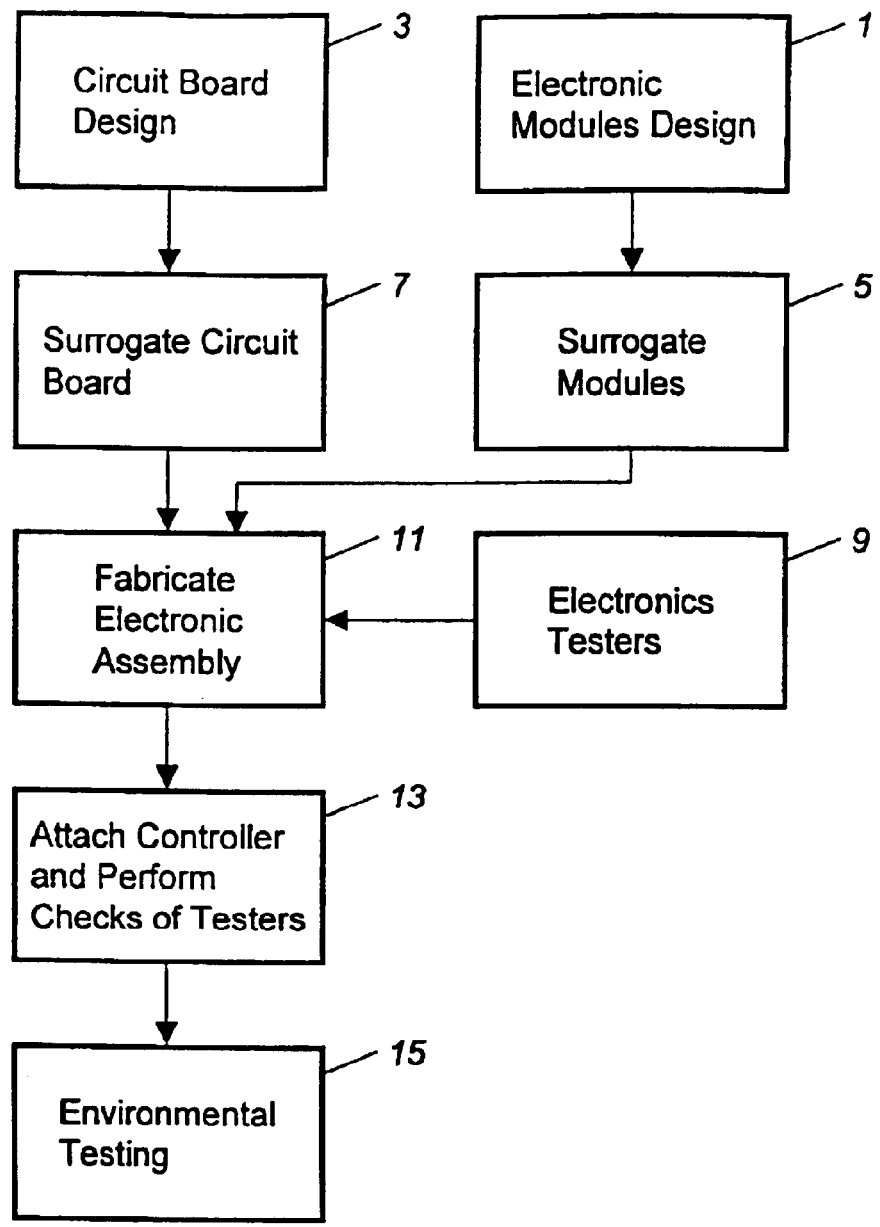
FIG. 1 is a diagram of the new testing method.

Reference is made to the flow-chart of FIG. 1, which illustrates the general steps for accomplishing the test of the solder joints. Circuit designers of an electronic assembly typically first specify a design 1 for an electronic module (or electronic modules) for the electronic assembly and a design for the circuit board 3 to which the electronic modules are to be assembled. Given that purpose, for the environmental test a "dummy", "specimen" or, as variously termed, "surrogate" module is designed and constructed 5. The surrogate module need not contain the electronic circuitry of design 1, but should contain essential thermal and mechanical features such that its behavior under stress is representative. Ideally it should be of the same form and fit. That is, the modules contain the same connection technology, such as the ball grid array, earlier referred to, and must fit in the location intended in the circuit board design 3. Instead of the internal wiring specified by the original design 1, however, the surrogate module is internally wired for the testing in the manner later more specifically described in connection with FIG. 4. Construction of the surrogate module is accomplished using the same construction technology used for the module of the original design.

For like purpose, a dummy, specimen or, as variously termed, surrogate circuit board is designed and constructed 7. The surrogate circuit board should contain essential thermal and mechanical features such that its behaviour under stress is representative. Ideally it should replicate the form and fit of the original multi-layer circuit board design 1, and contain the same number of layers and bonding pads to connect to the module (or modules) intended for the electronic assembly.

The circuit board may also contain many representative internal vias. The design of the surrogate circuit board however, differs somewhat from the original design 3. Instead of the original on-board wiring to those bonding pads, the on-board wiring for those bonding pads is designed as later herein described in greater detail in connection with FIG. 4. The purpose of the on-board wiring is to form one or more "target series circuits". In the target series circuit the solder joints that are formed between the terminals of the surrogate module, eg. the balls of the ball grid array and the bonding pads of the circuit board define one or more electrical DC series circuits. Further, the surrogate circuit board contains additional bonding pads to secure and connect the electronic testers, referenced at block 9; and contains four additional wiring circuits or buses for receiving and distributing to electronic tester 9 operating voltage, circuit ground, and a pair of wires for a reset bus and a test bus, later herein described in greater detail in connection with FIGS. 3 and 5. Electrical connections and bonding pads 6 are also provided for inclusion of a pilot lamp 8 on the circuit board. The surrogate circuit board is constructed using the manufacturing technology that is intended for use in fabricating circuit board design 3.

Electronic testers 9 are each capable of monitoring the continuity of a DC series circuit, the associated "target series circuit" referred to in the preceding paragraphs, and provide a persistent indication of any break in the continuity of that circuit to alert the test operator. The tester may be quite simple in structure. The tester may be a bi-stable switching device that maintains one output state, until the occurrence of an interruption, and then switches to a second output state that causes the energization of a visual indicator or the like, and remains in that second output state until reset by the operator. As will be appreciated from the following description, the electronic tester (and associated indicator) is constructed of components that are known to be capable of surviving the environmental testing to be applied to the electronic assembly.

Surrogate modules 5 and electronic testers 9 are then assembled to the circuit board to fabricate the electronic assembly 11, the "surrogate" electronic assembly. The fabrication technology employed is that which is intended for the original circuit board and electronic module design, the details of which are not material or relevant to the present invention. Following the fabrication of the electronic assembly, a controller for electronic testers 9, positioned external to and separate from the electronic assembly, is electrically connected to the electronic assembly 13 to enable control of the tester. Certain preliminary checks are then made of the operation of the testers, later herein more fully described. When the testers operational status is ensured, environmental testing 15 of the electronic assembly may commence. The foregoing are illustrated and described with greater particularity in connection with the discussion of FIGS. 2–5, next considered.

Figure 2:
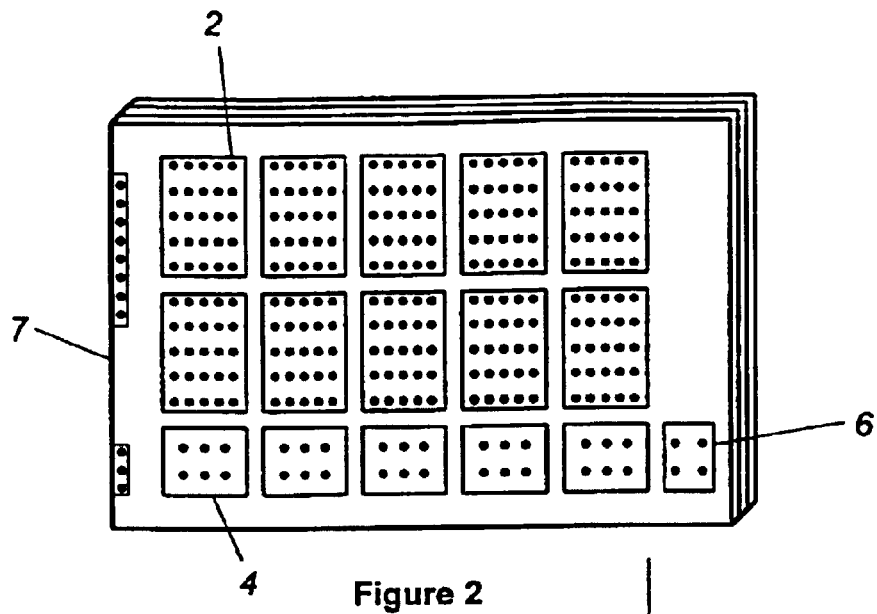
FIG. 2 pictorially illustrates a surrogate multi-layer circuit board used in the practice of the method of FIG. 1 and for incorporating the invention.
Figure 3:
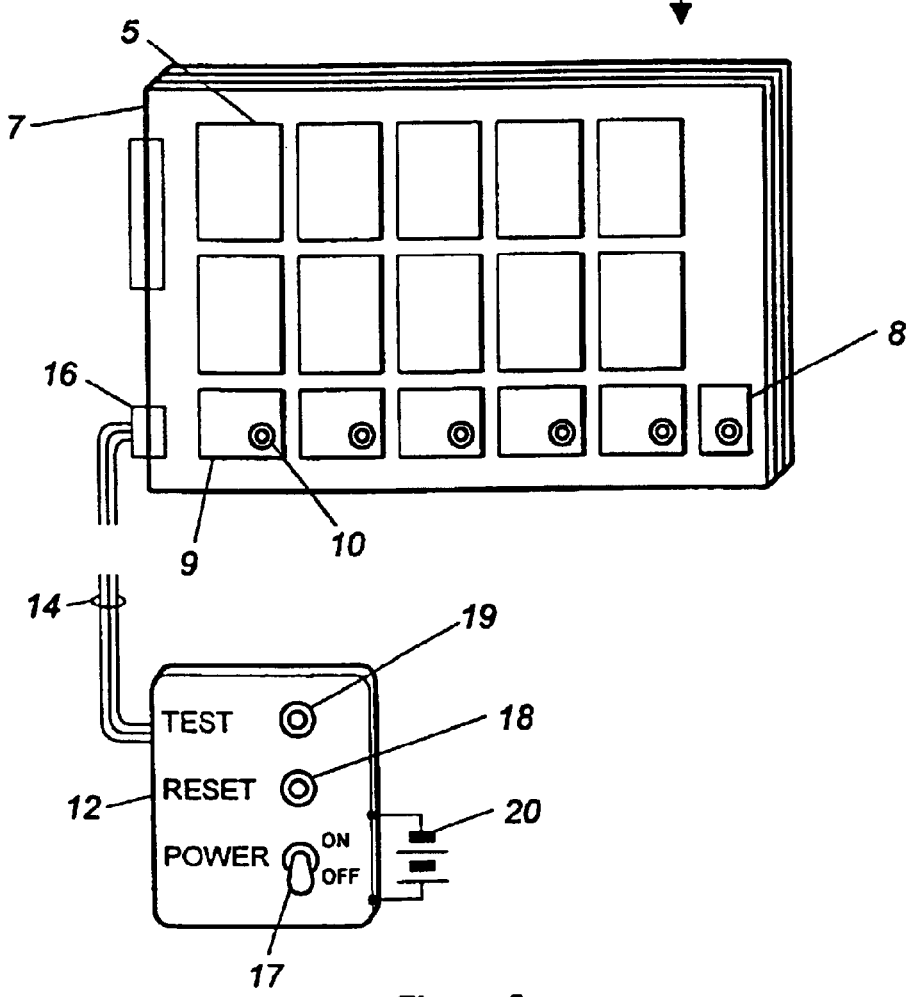
FIG. 3 pictorially illustrates a test assembly that incorporates the circuit board of FIG. 2, surrogate electronic modules, the testers used to monitor solder joints in those modules and the controller for the tester.

FIG. 2 pictorially illustrates the "specimen" or "surrogate" circuit board 7 used in the practice of the new method and apparatus and FIG. 3 illustrates the completed electronic assembly, containing the circuit board of FIG. 2 and the electronic modules. Referring to FIG. 2, specimen circuit board 7 is essentially an imitation of a circuit board that is to be placed into industrial practice. The surrogate circuit board is manufactured using the same technological processes and incorporates the same essential layout for the electronic modules as intended for the principal circuit board, but with changes in wiring that enable the practice of the invention that are hereafter set out in greater detail. Such a circuit board, and, hence, the surrogate circuit board, typically, is a multi-layer circuit board that contains the metal bonding pads 2 to which the electronic modules 9 are attached following assembly of the latter to the circuit board. The circuit board also contains the internal vias and wiring through and in the various levels of the layers, not illustrated.

Bonding pads for ten different modules are illustrated, each of which is indicated as having four columns or "lines" with each line containing five bonding pads. As those skilled in art appreciate, the foregoing reduced number of bonding pads is for simplicity of illustration and description. A circuit board for an advanced electronic assembly may contain dozens or even hundreds of modules, in which each module may contain an array of dozens of rows and columns of bonding pads such that the number of bonding pads totals hundreds or perhaps over a thousand (and like contacts or terminals on the underside of each electronic module), while the circuit board may contain twenty-four or even more layers. In addition to the bonding pads for the electronic modules, the surrogate circuit board contains additional bonding pads 4 for the electronic tester that is also attached to the circuit board; and some additional wiring.

Reference is made to FIG. 3. The figure pictorially illustrates the electronic assembly, namely the combination of surrogate circuit board 7, surrogate electronic modules 5, and testers 9, and associated connectors in an assembly. The electronic assembly is fabricated using the technology established by the designer for the assembly that is to be placed into industrial practice. As example, the modules 5 are attached to the bonding pads with a ball grid array. Solder paste is applied to the circuit board bonding pads and the modules are placed with the solder balls on their underside aligned with the corresponding bonding pads on the circuit board. The solder is reflowed, by convection heating or other suitable means, to form the solder joints between the balls and the bonding pads. That's the theory and the intended consequence. However, should the heating be non-uniform in distribution, or for one of many other possible reasons, one solder joint or another in the series could be defective. Among other things, the testing is to verify the integrity of the foregoing bonds, and, hence, "proof" the electronic assembly processes and the underlying technology used to produce the assembly.

Testers 9 are also attached to circuit board 7 in the same way and at the same time as electronic modules 5, which is the most efficient way, and, hence, is preferred. Although pictorially illustrated in FIG. 3, in practice testers 9 comprise a standard semiconductor chip package. As later herein described, a preferred embodiment of the detector is a standard integrated circuit latch packaged as a Small Outline Integrated Circuit ("SOIC").

Each tester 9 includes or is associated with an indicator lamp, such as an LED 10, which is directly supported on circuit board 7 or is indirectly supported, such as being included inside or on the tester as pictorially illustrated in the figure. A controller 12 for the testers is coupled to wiring on the circuit board via a cable 14 and circuit board connector 16. The controller supplies the DC voltage for operation of the tester. The controller also contains a power switch 17, reset switch 18 and test switch 19. During environmental testing, controller 12 remains outside the test chamber, and need not be designed to withstand the environmental extremes to which the surrogate electronic assembly is subjected.

Each surrogate module 5 assembled to the surrogate circuit board 7 contains the balls of the ball grid array as contacts that form respective solder joints with an associated bonding pad of the circuit board. The internal wiring of the module and the wiring of the bonding pads is such as to define a "target series circuit" for the associated tester. An example of the wiring of the surrogate electronic module and the surrogate circuit board is partially illustrated pictorially in FIG. 4 to which reference is made.

In this pictorial surrogate module 5 includes a row of ten terminals or solder balls, 5a–5J. Terminal 5a is wired to terminal 5b, terminal 5c is wired to terminal 5d, and so on through the wiring of terminal 5i to 5j, forming five discrete pairs of connected adjacent terminals. Surrogate circuit board 7, partially illustrated, contains a like row of bonding pads, 2a–2j, that are to be placed in contact with and bonded to corresponding terminals of the electronic module 5. Each bonding pad in the row is positioned to be aligned with a respective one of the terminals 5a–5j of module 5 when the module is positioned in the appropriate spaced on the circuit board. The bonding pads at the top and bottom end of the rows, 2a and 2j, are wired (partially illustrated) for connection indirectly or directly to positive polarity voltage and ground connections, elsewhere herein described. The intermediate bonding pads are formed into discrete pairs of bonding pads in which the bonding pads in a pair-are electrically connected together. As shown, bonding pad 2b is wired to bonding pad 2c, bonding pad 2d is wired to bonding pad 2e, and so on, through wiring bonding pad 2h to bonding pad 2i.

When the electronic assembly is fabricated, module 5 is placed over the bonding pads on the circuit board, and the solder is reflowed to mechanically and electrically connect the bonding pads to the respective terminals of the module. Thus pad 2a is connected to terminal 5a, pad 2b is connected to terminal 5b, pad 2c is connected to terminal 5c, and so on through the connection of pad 2j to terminal 5j. As one may visualize, with the described connections and wiring, a DC series circuit extends in a "daisy chain" or serpentine path through the connections, from bonding pad 2a through bonding pad 2j, and that serial path includes each of the formed solder joints between the pads and the terminals. The foregoing series circuit is referred to herein as a "target series circuit".

Figure 4:
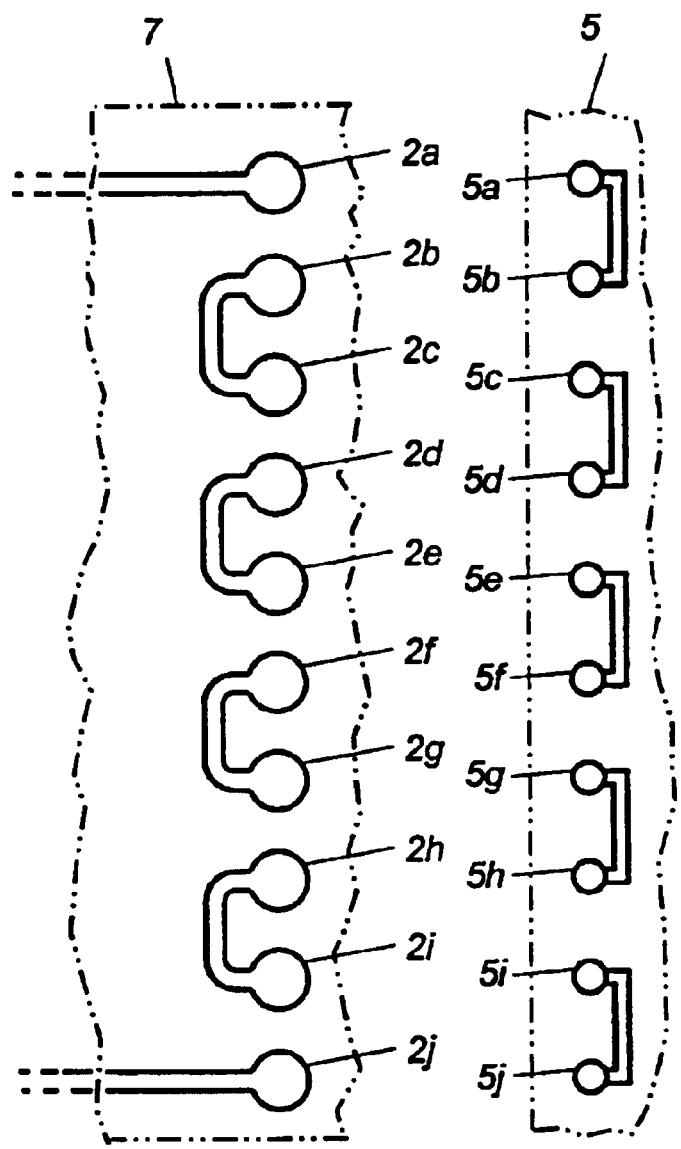
FIG. 4 is a partial pictorial view of the upper surface of the circuit board of FIG. 2 in greatly enlarged scale showing the wiring of some bonding pads for a module and the wiring of the module to provide a target series circuit for a tester to monitor.
Figure 5:
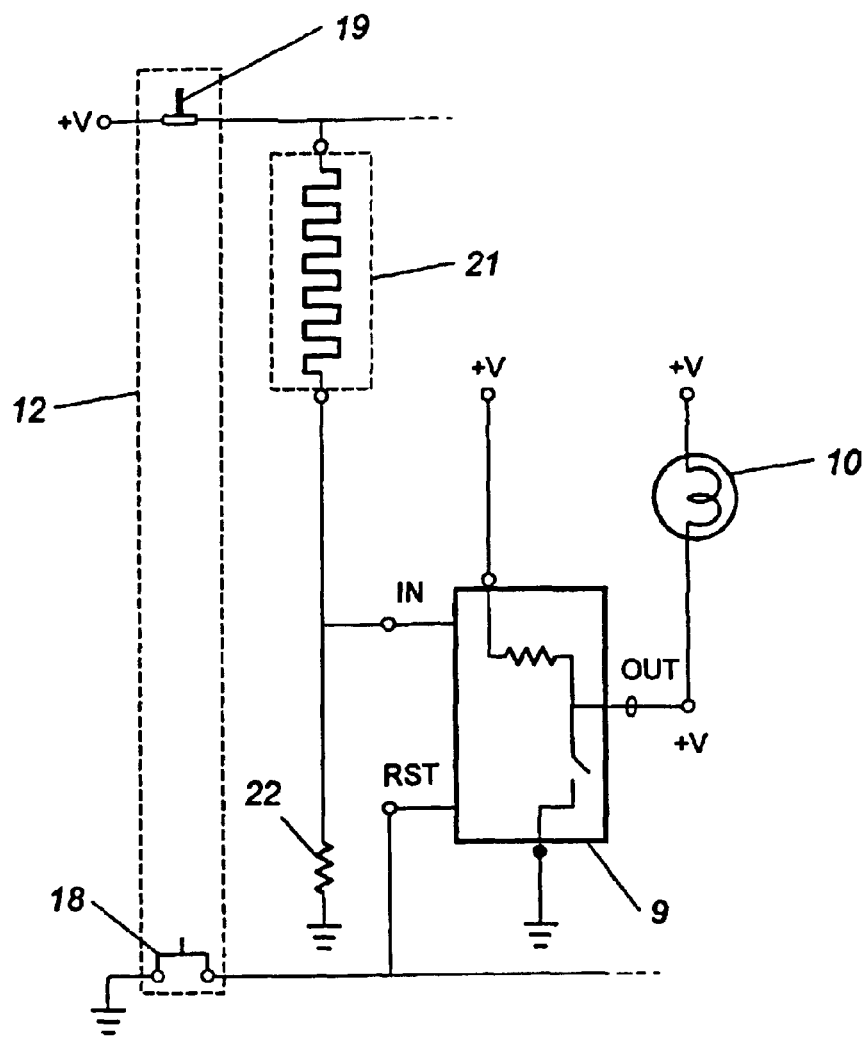
FIG. 5 is an electrical schematic of the testing circuit.

The test configuration of FIG. 3 is partially illustrated schematically in FIG. 5 to which reference is made. In this figure, the test series circuit, described in detail in FIG. 4, is denominated as 21. Controller 12 is partially illustrated in a dash line box and contains momentary normally closed switch 19, the test switch, and normally open switch 18, the reset switch. Since the resistance of the test series circuit is low or negligible, the voltage applied to the input "IN" of the tester 9 is normally a positive voltage high (+V).

Should an interruption or break occur in that series circuit, as an example, should one of the solder joints open up, even temporarily, then the voltage high is removed from the input IN, at least temporarily. That leaves the connection through resistor 22 to ground, a voltage low. Prior to such break, the output of tester 9 is at a voltage high, whereby the one terminal of the indicator lamp 10 connected to that output is at the same potential as the other terminal of the lamp. Consequently, no current flows, and the indicator lamp remains deenergized.

Should an interruption occur in the test series circuit during environmental testing (or otherwise), the tester switches to its second bistable state, switching the output thereof to a voltage low (ground). With a voltage low now applied at one terminal of the indicator lamp and a voltage high at the other terminal, sufficient current is drawn to energize lamp 10, which illuminates. The illumination serves as the alert of the series circuit interruption for the operator. Tester 9 remains in the latter state, until reset by the operator. Resetting is accomplished by momentarily connecting an appropriate reset voltage to the reset RST input of the tester. The latter function is accomplished in the schematic by operation of switch 18 in controller 12 to momentarily apply ground, a voltage low, to the /RST input.

Qualification testing is used to subject a component to the extremes of the environmental conditions to which the component could be exposed in application and ensure reliability. Principal elements of such testing, particularly for space applications, are temperature, shock, and vibration. Typically the electronic component is designed to be operable over a temperature range of as much as –60 degrees F. to +200 degrees F., survive vibration of up to 30 Grms distributed from 50 to 2,000 Hz, and survive pyrotechnic shock of up to 5,000 G's. In the present instance, the purpose is to ensure that the manufacturing processes produce bonding of all the contacts of the modules sufficient to pass testing representative of these environments. As one appreciates, thus, tester 9 and the indicator lamp 10 must be components that are designed and intended to operate throughout such a range of temperature, vibration, and shock, since those components are also carried on the circuit board.

Referring again to FIG. 3, in preparation for testing, the power switch 17 is operated, connecting a source of voltage, battery 20, to the circuits of the controller, thereby extending the positive terminal of that voltage source over a lead in cable 14 to the testers 9, as first polarity voltage, and the negative terminal of that source over a second lead in the cable to the testers as the circuit ground. That action provides operating power to all of the testers and to indicator lamp 8, the pilot indicator, the latter of which indicates that electrical power is being received in the electronic assembly.

To ensure that all testers are in the normal or first output state (and all of the associated indicator lamps are extinguished), reset switch 18 is manually operated. That switch operation momentarily produces an appropriate voltage over another lead in cable 14 that is applied in multiple to a reset input of each of the testers 9 on the circuit board. Any of the testers that may have been in the second output state are thereby reset to the first output state. If all testers are properly functioning, all indicator lamps associated with the testers should thus be de-energized and extinguished, which the operator may visually confirm.

Operation of lamp test switch 19 momentarily opens the bias voltage supplied to all of the testers through the respective associated "target series circuit", simulating an interruption in the latter circuit. Since each tester is intended to detect an interruption in the target series circuit, each tester should thus switch to its second output state causing the associated indicator lamp to illuminate. If all of the tester indicators are thus illuminated, the operator is assured that all testers are functioning. The operator may then again operate reset switch 18 to restore the testers 9 to their respective first output states, extinguishing all associated indicator lamps.

Figure 6:
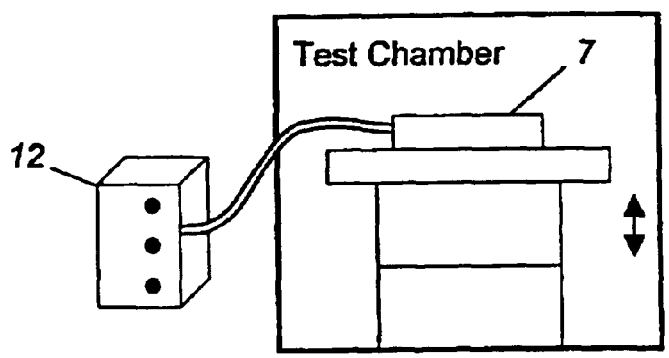
FIG. 6 is a pictorial of the environmental test of an electronic assembly.

The circuit board 7 carrying the electronic modules is then placed either in a test chamber or on the test fixture, pictorially illustrated in FIG. 6, while the controller is positioned, respectively, outside the chamber or off the test fixture. As example, the electronic assembly may be subjected to a wide range of temperatures, and/or may be vibrated at different intensities and frequencies. If at any time during the test a solder joint that is located in a test series circuit opens, even momentarily, the indicator lamp for the tester that is associated with the foregoing series circuit will illuminate, and remain illuminated. During the environmental test or after that test has been completed, the operator may determine and record which testers have illuminated. For those that are illuminated, the operator may now investigate the associated test series circuit to determine the cause of the break. Stresses and strains produced on the solder joints are not entirely uniform but differ depending on the location of the solder ball. Once the location of the fault is learned, the designer can make appropriate changes in design or technology to cure the problem.

Figure 7:
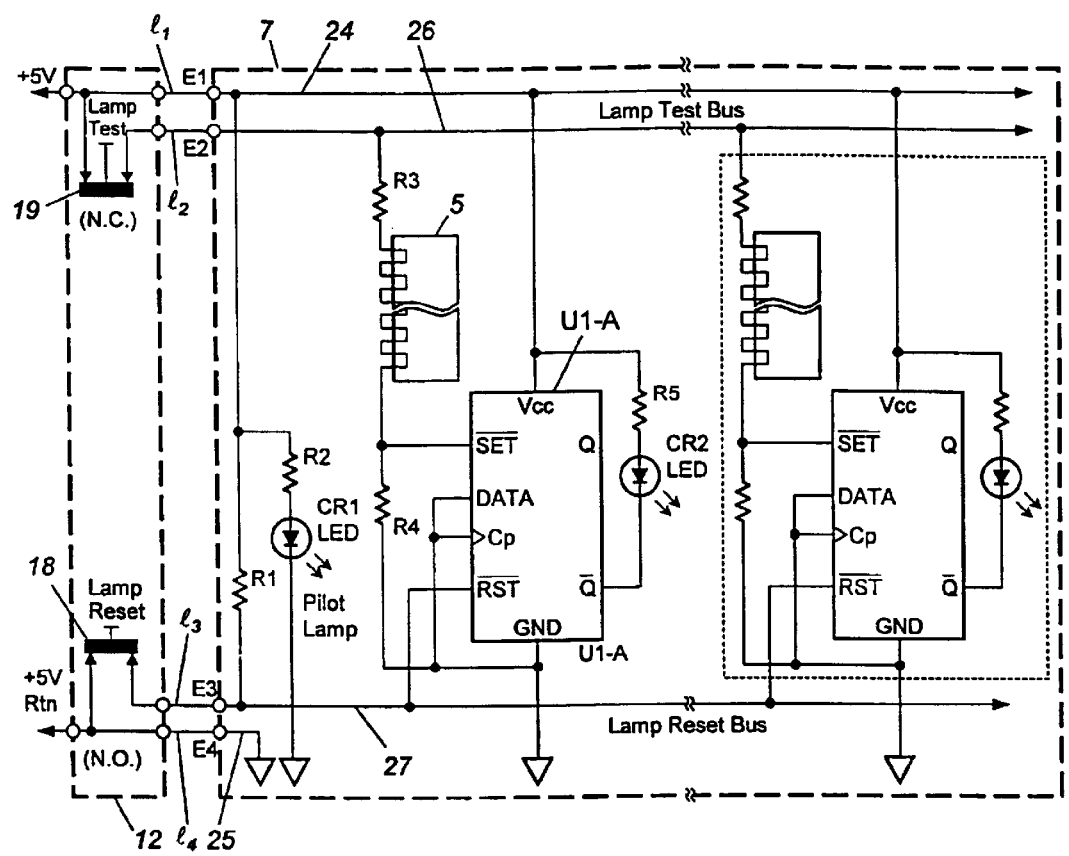
FIG. 7 is a schematic diagram of a specific embodiment of the tester and test circuit used in the new method.

A specific embodiment of the system is schematically illustrated in FIG. 7 to which reference is made. For convenience, where an element of this embodiment was included in a prior illustration and identified, the denomination previously given that element is also used in this figure. Circuit board 7, represented in dash lines, contains the surrogate electronic module 6. Tester 9 of this embodiment includes a high speed CMOS Flip-Flop U1-A, resistors R3, R4 and R5, and light emitting diode lamp ("LED"s) CR2 and functions together with surrogate module 5 to detect certain transient circuit interruptions as may occur through the test series circuit 21 through module 5. The flip-flop contains set /SET, reset/RST inputs, Clock input, Cp, and DATA inputs. The flip-flop, also known as a bistable multivibrator, is a known electronic circuit that has two stable output states: one state in which the output is high and the other in which the output is low. The flip-flop contains one or more input terminals that serve as the controls and has two output terminals, Q and /Q that are mutually complementary and always in opposite states. Preferably, flip-flop U1-A is a multiple type, which contains two or more independent flip-flops in a single package or chip. However, only one of the flip-flop segments is used in association with module 5. The remaining flip-flop segment(s) are preferably used for detection in association with a separate test series circuits in the same module or an adjacent surrogate module and its associated test series circuit on the circuit board.

The electronic assembly is typical and contains many electronic modules packed together on a circuit board, all of which are tested simultaneously. For that purpose, the foregoing tester circuit is iterated on the circuit board to include as many iterations of the test circuit as appropriate. However, only one additional tester (eg. detector) circuit, the $n^{th}$ detector circuit, is illustrated in FIG. 7 contained in dash-line box 23, and is identical in all respects with the detection circuit previously described.

LED CR-1 and resistor R2 provide a pilot lamp circuit. In the example, flip flop U1-A is one half of a positive edge-triggered dual D flip flop which also includes inverted set and reset inputs. For this application the data and clock inputs are grounded and not used. Pull-up resistor R1 supplies a logical "1" to the Lamp Reset bus which is connected in common to the /RST flip-flop input of each iterated detector circuit. This resistor limits current when the Lamp Reset button is depressed, momentarily shorting the Lamp Reset bus to ground. Surrogate circuit board 7 includes conductive lead 24, a power bus that supplies power to flip-flop U1-A at the Vcc input; a lead 25 for circuit ground, which connects to the GND (ground) terminal of flip-flop U1-A, to the clock input Cp and to the data DATA input; a lamp test bus 26 and a lamp reset bus 27.

The foregoing components, except the controller and the associated cable, reside on the circuit board. As earlier described, the circuit board is fabricated using the technology specified by the designer for the final circuit board and the components described are mounted to the circuit board using the same technology intended for the final electronic module. Thus, where the designer calls for mounting of electronic modules to the circuit board using a ball grid array, the corresponding surrogate modules are connected to the corresponding positions on the circuit board using the ball grid array. As one recognizes, the detail of the foregoing fabrication technology is not important to the invention and does not aid in understanding the invention. Accordingly, those details need not be addressed.

Test control circuit or, as variously termed, controller 12, through which DC power is applied to circuit board 7, is represented in dash lines in the figure. Controller 12 provides lamp test and lamp reset functions. The controller contains a pair of momentary operate or push-button switches 19 and 18, the former being of the normally closed type, and latter being a normally open type. In practice, the controller is typically constructed on a separate small chassis having terminal blocks or connectors for convenient attachment of connecting leads. Four electrical leads, L1, L2, L3 and L4, connect respective output terminals of the controller to respective input terminals, E1, E2, E3 and E4, of the circuit board 7. Since the controller is intended to remain positioned outside the test chamber into which the electronic assembly of the circuit board and the supported contents thereof is placed for testing, the foregoing leads may be relatively long. Since the high-speed transient response capability is local to each module being tested, the length of these controller leads does not affect performance.

Power supply terminals are included for connecting the controller to a DC power supply, not illustrated. One supply terminal, labeled +5v, connects the positive polarity voltage of the external supply, suitably +5 volts, to a terminal of normally closed switch SW-1 and the output terminal to lead L1. The other supply terminal, labeled 5V Rtn, connects the other polarity of the external supply (or ground) to one terminal of normally open switch SW-2 and to the output terminal to lead L4. As becomes apparent from the description, controller 12 may be used to control all detection circuits on a single circuit board, and may be used to control all detection circuits on multiple circuit boards.

In operation, when power is initially applied, controller 20 applies +5 volts over lead 24 to supply power to the flip-flop U1-A; and also applies that voltage over lead 26, the lamp test bus, to supply the DC voltage to one end of resistor R3. From the voltage divider formed of low-value resistor R3 (including the serial path through specimen module 24) and high-value resistor R4, the voltage applied at resistor R4 to the /SET input of the flip-flop is a voltage high and pulls the set-bar (/SET) input to a logical "1" state. Concurrently, the positive +5 volts is applied through resistor R1 to reset bus 27, and, thence, to the reset-bar (/RST) input of the flip-flop, which also pulls the input to the logical "1" state. With both such inputs at logical "1", the initial output condition of the flip-flop is indeterminate as a result: The complimentary outputs Q and Q-bar may be in either allowable logic state "1" or "0" at this juncture.

Lamp reset switch 18 is momentarily operated, momentarily grounding reset bus 27 and the reset-bar (/RST) input to the flip-flop, momentarily producing a logical "0" input at the reset-bar (/RST) input. The flip-flop in response switches the output at Q to the logical "0" state and the output at Q-bar set to the logical "1" state. In this reset state, the net voltage drop across resistor R5 and LED CR2 is minimal, and, hence, LED CR2 does not illuminate. At this stage the detection circuit is prepared to detect any continuity failures in the series circuit through specimen module 7. Since the reset input of all iterations of the foregoing circuit, such as by way of example detector 23 are connected in common to the lamp reset bus 27, operation of the reset button 28 produces the same effect on the respective flip-flop in those detectors.

Should the test series circuit that extends in the serpentine path through specimen module 5 be broken, as elsewhere herein described, the path to resistor R3 and the +5 volts at that resistor is thereby broken. In that event the /SET input is essentially placed at ground potential via resistor R4, pulling the /SET input to a logical "0". In response to that input, the flip-flop switches to the alternate set state, producing a logical high (eg. "1") at output Q and a logical low (eg. "0") at output Q-bar to which an end of LED CR2 is connected. Since one end of LED CR2 is now at a voltage low, and the end of resistor R5 is at the +5 volts at bus 24, current flows through R5 and CR2, applying full forward voltage across CR2, causing the LED to illuminate.

The change of state or, as variously termed, "flipping of the flip-flop occurs even though the break in the serpentine current path is exceedingly brief, a transient interruption, because the flip-flop is very fast. The flip-flop is capable of responding to interruptions that are of sub-microsecond duration. Once the flip-flop has thusly flipped, the LED remains lighted so long as power is supplied to the circuit board by controller 12 or until lamp reset switch 18 is operated. Irrespective of whether the break in the series circuit is permanent or transient, the detector detects and displays the indication of a break continuously. The test operator may thus record the break when it is most convenient to do so. Alternatively, the status of the LEDs may be recorded continuously using an ordinary "camcorder". This approach is especially applicable to vibration testing where the sequence of failures in a short duration test may be of interest.

Test button 19 is momentarily operated to assure that all the fail indicators, the LED's are operational. When operated, the switch momentarily interrupts the application of the +5 volts to lead 26, effectively simulating a break in the series circuit through the respective specimen in each of the detector circuits included on the circuit board. When the +5 volts is removed, the flip-flops of each detector are flipped, causing illumination of the associated LED, such as CR2, in the manner earlier described. If an LED fails to illuminate the operator may log that information, and discount that particular LED when the circuit board is subsequently tested. However, discounting that LED, means that the particular specimen module associated with that LED is virtually untested. Preferably, the defective LED is repaired or replaced, prior to testing the circuit board. If none of the LED's require repair or replacement, the operator then operates the lamp reset switch 18, which results in resetting the flip-flop of each detector, extinguishing the associated LEDs and preparing the detector circuit for application.

Resistor R2 and LED CR1 perform a simple pilot light function. So long as the controller supplies power to the circuit board, LED CR1 remains lighted. That pilot function precludes a power failure that occurs during the coarse of a test from being misinterpreted as a lack of failures.

As a specific example, resistor R1 is 100 ohms, resistor R2 is 80 ohms, R3 is 100 ohms, R4 is 1,000 ohms, and R5 is 680 ohms. Flip-flop U1-A is a type 54HCT74 available commercially in a SOIC package from various suppliers such as the Digi-Key Corporation located in Thief River Falls, Minn., and the LED's are standard low-power red types in SOT packages.

The values of the resistors in the circuit are not critical. Resistor R1 serves as the pull-up for all the iterated test detectors included on a single circuit board. That resistor should be low enough in value to supply sufficient current to the multiple electrical loads so that a logical "1" is maintained at the reset /RST inputs of all of the flip-flops for the plurality of detectors included on the circuit board. Resistors R2 and R5 provide a current limiting function for the associated LED's. If those resistors are too low in value, the increased current could jeopardize the LED and/or the IC latch (eg. flip-flop), particularly during high-temperature testing of the circuit board. Resistor R3 is intended to isolate unintended shorts to ground in the daisy chain series circuit, and is regarded as optional. During operation, a short circuit of that kind without R3 would cause all fail indicators to illuminate or short circuit the power supply through the normally closed lamp test switch SW1. Resistor R3 should be low enough in resistance to overcome the counteracting pull-down of resistor R4, when the series "daisy chain" circuit is correctly functioning, but not low enough in resistance to overheat in the event of a short in that daisy chain circuit.

The series circuit through the terminals of the specimen and the corresponding bonding pads on the circuit board provides a "daisy-chain" or serpentine appearance in geometry, which is preferred. As those skilled in the art realize, that test series circuit through the circuit board and associated surrogate module may be configured or wired to create other patterns in appearance without departing from the scope of the invention. All that is necessary is that each connection of a bonding pad on the circuit board with an associated electrical terminal of the specimen module that is to be tested for failure should be included in the test series circuit to the input of the tester.

In the pictorial illustration of FIG. 4, the surrogate module contained only a small number of terminals arranged in a row, and those terminals were incorporated in the test series circuit. In practice a module may contain many more terminals in one row and may contain a number of such rows, forming an array of terminals. Where such terminals are fused to solder balls to make the solder joint with the bonding pad of the circuit board, the module is said to include a solder ball array. When the circuit board is to contain a large number of modules densely packed together on the circuit board, as example, one-hundred modules, the object of testing may be to locate the particular one or more modules in the group of one-hundred modules in which a solder joint fails, eg. to find the geographic regions on the circuit board at which soldering may be unsatisfactory. To serve that function, all of the terminals in all of the rows of terminals in a module and all of the associated bonding pads of the circuit board are each wired so as to form a single test series circuit. Accordingly, the circuit board will contain one hundred modules, one hundred separate test series circuits and one-hundred continuity testers.

If, however, the designer wishes to obtain more specific information on the location of a faulty solder joint within a given module, that also can be accomplished by forming multiple test series circuits in each module, and including separate continuity testers for those multiple test series circuits. As an example, if, as in the preceding circuit board, there are one hundred modules, and, if each of those modules contains four separately interconnected sub-arrays of module terminals, one may form a test series circuit for each sub-array of module terminals. Each sub-array of module terminals and each corresponding sub-array of bonding pads on the circuit board are respectively wired in the manner illustrated in FIG. 4 to form a single series circuit that is connected to an associated continuity tester. The overall result is that the electronic assembly will contain four hundred continuity testers for the one hundred modules in the given example. Should a solder joint of a module fail during test, the indicator lamp of the continuity tester associated with that sub-array will illuminate, identifying both the module and the sub-array of terminals where the defect appears.

The dedication of each continuity tester to a single surrogate electronic module produces what is sometimes referred to as a "staring" configuration, because, during the test, there is never a time when a transient failure could go unobserved. Essentially the monitor may be said to electronically stare at the associated test series circuit.

The electronic unit that detects the break in the test series circuit during environmental testing has been referred to as a tester. As one appreciates, that unit may be referred to by alternative names that are more functional. As example, the unit may be referred to as a detector, an interrupt detector, a continuity detector, a continuity tester, a monitor, as a bistable switch or as an electronic "staring" circuit. By whatever name chosen, the function and purpose of the tester remains the same or equivalent in the described method and combination.

As one appreciates the foregoing on circuit board continuity tester apparatus and the testing method provide a straightforward, inexpensive, simple and effective method and apparatus for enabling developmental testing of electronic assemblies in the pre-production stage.

The foregoing process and apparatus has been described to locate a defective circuit board-to-module solder joint in the module of an electronic assembly during environmental testing, which accomplishes a principal purpose of the invention. As those skilled in the art appreciate, due to the simplicity of the foregoing arrangement, the foregoing test can be adapted to an earlier stage of development. As example, the foregoing procedure and apparatus may be used to test the reliability of the circuit board fabrication technology and design, specifically the reliability of the circuit board wiring. This may be done by establishing all of the "daisy chain" test series circuit interconnections within the circuit board itself and eliminating the need for separately attached modules to complete the test series circuit. Features of interest may be wired in the manner illustrated in FIG. 4 for the circuit board but also including the wiring in the module so as to form a test series circuit, the daisy chain structure earlier described. This circuit board contains the circuitry for the continuity tester and controller connection, much as previously described for the testing of the surrogate modules, and carries the continuity tester. Basically, one obtains the same circuit that is illustrated in the schematic of FIG. 5, but in which the test series circuit 21 is formed through the features wholly contained with the circuit board itself.

As assembled the circuit board and tester components assembly is subjected to environmental testing as may reveal undesirable fragility in the electrical vias of the circuit boards and/or wiring however unlikely that may be. If by chance, such fragility is found, as would result in illumination of an indicator lamp of the continuity tester, the problem may be located and fixed. As one appreciates, the circuit board design and fabrication technology may be "proofed" or qualified in the foregoing manner prior to qualifying the solder joints of the electronic assembly in the manner earlier described.

It is believed that the foregoing description of the preferred embodiments of the invention is sufficient in detail to enable one skilled in the art to make and use the invention without undue experimentation. However, it is expressly understood that the detail of the elements comprising the embodiment presented for the foregoing purpose is not intended to limit the scope of the invention in any way, in as much as equivalents to those elements and other modifications thereof, all of which come within the scope of the invention, will become apparent to those skilled in the art upon reading this specification.

As example, those skilled in the art may readily incorporate an automated recording feature that records the status of the LED indicators in the testers. To implement the foregoing feature, a small amount of digital circuitry is added to the circuit board to monitor and report the Q state of each tester in sequence. The report may be transmitted by the digital circuitry via a single connection to an ordinary personal computer that is interfaced to the off-board controller. Although adding some complexity, as modified, the test arrangement includes all the advantages of low cost, minimal number of off-board wiring, and extremely fast response from dedicated "staring" testers, referred to earlier in the Summary of the invention, while nearly eliminating the need for operator attention and/or intervention. Thus, the invention is to be broadly construed within the full scope of the appended claims.

What is claimed is:

1. A method for proof of the manufacturing technology used to fabricate electronic assemblies, said electronic assemblies containing a plurality of electronic modules mounted to a circuit board, said circuit board including a plurality of electrically conductive bonding pads for connection to a respective corresponding plurality of electrically conductive terminals of an electronic module, said plurality of electrically conductive bonding pads including at least one group of electrically conductive bonding pads, said group of bonding pads comprising any one of a row, or zone, or array, or sub-array of bonding pads; said electronic modules including electric terminals secured to said bonding pads on said circuit board, comprising the steps of:

fabricating a surrogate circuit board using said manufacturing technology, said surrogate circuit board replicating said circuit board at least in the principal thermal and mechanical features thereof, including size, shape, and bonding pads, wherein said surrogate circuit board includes a plurality of electrically conductive bonding pads for connection to a respective corresponding plurality of electrically conductive terminals of an electronic module, said plurality of electrically conductive bonding pads of said surrogate circuit board including at least one group of electrically conductive bonding pads;

said surrogate circuit board further including wiring for electrically individually connecting together each bonding pad in said group of bonding pads, excepting a first and second bonding pad in said group of bonding pads, with only one other bonding pad in said group of bonding pads, excepting said first and second bonding pads, to form a plurality of bonding pad pairs, exclusive of said first and second bonding pads;

said surrogate circuit board further including a first voltage bus, a ground bus, electrical bonding pads for securing a continuity monitoring device, wiring for connecting said first voltage bus to said first bonding pad, and wiring for connecting an input of said continuity monitoring device to said second bonding pad;

fabricating a surrogate electronic module, said surrogate electronic module replicating said electronic module in at least the principal thermal and mechanical features thereof, including size, geometry and plurality of electrically conductive terminals, said plurality of electrically conductive terminals including a group of electrical terminals, said surrogate electronic module further including internal wiring connecting each one of said terminals in said group of electrical terminals to only one other terminal in said group of electrical terminals to form a plurality of pairs of terminals, said internal wiring being such as to define with said plurality of pairs of bonding pads and said first and second bonding pads of said surrogate circuit board a DC series circuit when said terminals are secured to associated bonding pads in said group of bonding pads with said first and second bonding pads defining first and second ends to said DC series circuit;

securing said surrogate electronic module to said row or zone or sub-array of bonding pads on said surrogate circuit board using said manufacturing technology to define said DC series circuit between said first and second bonding pads;

securing a continuity monitoring device to said surrogate circuit board, wherein said input of said continuity monitoring device is electrically connected to said second end of said DC series circuit, said continuity monitoring device including an indicator lamp;

applying a DC voltage to said first voltage bus, wherein said DC voltage is applied through said DC series circuit to said input of said continuity monitoring device so long as said DC series circuit is uninterrupted;

said continuity monitoring device being responsive to the application of a said DC voltage for preventing operation of said indicator lamp, and responsive to withdrawal of said DC voltage for operating said indicator lamp to place said lamp in an operated condition and maintaining said display lamp operated thereafter to provide a persistent indication irrespective of the reapplication of said DC voltage;

subjecting said surrogate circuit board to stresses, said stresses including any one or more of bowing, twisting, temperature variation, sinusoidal or random vibration, and shock over a range of intensities and durations; and inspecting said indicator lamp to determine if an interruption occurred in said DC series circuit.

2. The method of detecting transient failure of at least one connection in a set of electrical connections that secure an electronic module to a circuit board comprising the steps of:

creating a series electrical circuit through said set of electrical connections and corresponding electric terminals of said electronic module;

continuously monitoring said series electrical circuit for an interruption and producing a persistent indication in the event an interruption occurs in said series electrical circuit; and subjecting said circuit board and the module secured to said circuit board to a variation in environmental condition to determine if such variation produces an interruption in said series circuit, and, if so, providing a persistent indication thereof.

3. The method of detecting transient failure as defined in claim 2, wherein said variation in environmental condition comprises shaking said circuit board in varying intensities.

4. The method of detecting transient failure as defined in claim 2, wherein said variation in environmental condition comprises exposing said circuit board to various ambient temperatures.

* * * * *